United States Patent
Tixhon et al.

(10) Patent No.: US 9,378,932 B2
(45) Date of Patent: Jun. 28, 2016

(54) DEVICE AND PROCESS FOR PREVENTING SUBSTRATE DAMAGES IN A DBD PLASMA INSTALLATION

(71) Applicant: ASAHI GLASS COMPANY, LIMITED, Chiyoda ku (JP)

(72) Inventors: Eric Tixhon, Crisne (BE); Joseph Leclercq, Sart en Fagne (BE); Eric Michel, Glain (BE)

(73) Assignee: ASAHI GLASS COMPANY, LIMITED, Chiyoda-ku (JP)

( * ) Notice: Subject to any disclaimer, the term of this patent is extended or adjusted under 35 U.S.C. 154(b) by 0 days.

(21) Appl. No.: 14/413,873

(22) PCT Filed: Jul. 9, 2013

(86) PCT No.: PCT/IB2013/055636
§ 371 (c)(1),
(2) Date: Jan. 9, 2015

(87) PCT Pub. No.: WO2014/009883
PCT Pub. Date: Jan. 16, 2014

(65) Prior Publication Data
US 2015/0206718 A1    Jul. 23, 2015

(30) Foreign Application Priority Data

Jul. 11, 2012 (EP) ..................... 12175855
Dec. 21, 2012 (EP) ..................... 12199072

(51) Int. Cl.
*H01J 37/32* (2006.01)
*G01R 31/00* (2006.01)
(Continued)

(52) U.S. Cl.
CPC ......... *H01J 37/32348* (2013.01); *C03C 17/002* (2013.01); *C03C 23/00* (2013.01);
(Continued)

(58) Field of Classification Search
None
See application file for complete search history.

(56) References Cited

U.S. PATENT DOCUMENTS 6,489,585 B1    12/2002    Nakamura et al.
6,635,228 B1    10/2003    Moore et al.
(Continued)

FOREIGN PATENT DOCUMENTS

DE    10 2010 024 135 A1    12/2011
EP       1 073 091 A2         1/2001
(Continued)

OTHER PUBLICATIONS

International Search Report issued Jan. 3, 2014, in PCT/IB2013/055636, filed Jul. 9, 2013.

*Primary Examiner* — Shamim Ahmed
(74) *Attorney, Agent, or Firm* — Oblon, McClelland, Maier & Neustadt, L.L.P.

(57) ABSTRACT

The present invention relates to a process for preventing substrate damages in an installation for surface treatment by dielectric barrier discharge (DBD) and a surface treatment DBD installation for carrying out such process. It comprises:—detecting the amplitude of the voltage at the terminals of the electrodes and the amplitude of the current circulating between said electrodes;—defining the maximum number of alternations of voltage at the terminals of the electrodes in the presence of a hot electric arc (n max) in order not to exceed 50 Joules as dissipated energy in said substrate;—when a hot electric arc appears between said electrodes, modifying with inverse feedback the voltage at the terminals of said electrodes before the defined maximum number of alternations of voltage at the terminals of the electrodes is reached.

10 Claims, 2 Drawing Sheets

(51) Int. Cl.
*C03C 17/00* (2006.01)
*C03C 23/00* (2006.01)

(52) U.S. Cl.
CPC ..... *H01J37/32458* (2013.01); *H01J 37/32715* (2013.01); *H01J 37/32743* (2013.01); *H01J 37/32944* (2013.01); *H01J 2237/32* (2013.01)

(56) References Cited

U.S. PATENT DOCUMENTS

| | | |
|---|---|---|
| 2004/0055869 A1 | 3/2004 | Moore |
| 2008/0106206 A1* | 5/2008 | Hooke ................ A61L 2/0011 315/111.21 |
| 2009/0159439 A1 | 6/2009 | Pipitone et al. |
| 2010/0068104 A1 | 3/2010 | Kim |
| 2010/0231194 A1* | 9/2010 | Bauch ............... H01J 37/32036 324/76.52 |
| 2010/0272617 A1 | 10/2010 | Moore |
| 2011/0121158 A1* | 5/2011 | Corke ..................... G02B 5/10 250/201.9 |
| 2011/0174333 A1 | 7/2011 | Tixhon et al. |
| 2012/0060759 A1 | 3/2012 | Moore |
| 2012/0156091 A1* | 6/2012 | Fridman ................... A61L 2/14 422/22 |

FOREIGN PATENT DOCUMENTS

| | | |
|---|---|---|
| EP | 1 870 974 A1 | 12/2007 |
| EP | 2 145 701 A1 | 1/2010 |
| WO | 2007/129800 A1 | 11/2007 |

* cited by examiner

DEVICE AND PROCESS FOR PREVENTING SUBSTRATE DAMAGES IN A DBD PLASMA INSTALLATION

FIELD OF THE INVENTION

The invention relates to a device and a process for preventing substrate damages, in particular by limiting or preventing hot electric arcs, in an installation for surface treatment by dielectric barrier discharge.

PRIOR ART

An electric arc detector for a cathodic sputtering process is known from US 2009/0159439. In brief, this technique consists of bombarding a target for the purpose of sputtering atoms in the form of particles that are then deposited onto the substrate. The purpose of the device described in this prior art is to detect a transition between a glow discharge stage necessary for normal functioning of the installation to an electric arc stage that has a harmful effect on the treated substrate. An arc corresponds to the creation of a conductive channel following adequate ionisation of the reactive gas and is characterised by a significant increase in the current that has drained towards the substrate. The electric arc detector according to US 2009/0159439 is equipped with a voltage and/or current sensor intended to control the value of these parameters on the substrate in order to compare them with threshold values characteristic of the occurrence of an electric arc.

US 2012/0285620 describes systems for extinguishing electrical arcs in a plasma processing chamber and a technique enabling power to return to a steady state level faster than traditional arc mitigation technique. It is not specifically directed to DBD installations and does not address the problem of arcing when specifically high power sources are used. This document is not at all directed to considering the threshold that a substrate can tolerate before being damaged.

DE102010024135 relates to a DBD installation with a system for detecting breakage of the dielectric coating of the barrier electrode. It comprises means for detecting an electrical short circuit due to a short-circuit discharge between an electrically conductive probe and the barrier electrode. The invention is said to lie within the fact that the probe is arranged at a relatively short distance from the barrier electrode. This document does not address the problem of arcing when specifically high power sources are used, nor the specific case of glass substrates. It is not at all directed to considering the threshold that a substrate can tolerate before being damaged.

SUMMARY OF THE INVENTION

An aim of the invention is to prevent damages to a substrate which is to be treated (e.g. prepared or coated) in an installation for surface treatment by dielectric barrier discharge, in particular a DBD installation for treating large plate-shaped pieces of glass or a continuously moving ribbon of glass. By substrate damages, we mean of course substrate breakage, but, before that, any damage which would provide a visual defect in the glass (for example a local deformation of glass due to local fusing).

Another aim of the invention is to prevent the occurrence of hot arcs that are harmful for the substrate and the electrodes of an installation for surface treatment by dielectric barrier discharge.

Still another aim of the invention is not to impede the triggering and maintenance in operation of filament discharges that constitute normal operation of an installation for surface treatment by dielectric barrier discharge.

The invention relates to a process for preventing substrate damages in an installation for surface treatment by dielectric barrier discharge (DBD) comprising the following steps:
  providing a DBD installation comprising a reaction chamber, in which are positioned means for supporting and/or moving a substrate and at least two electrodes arranged in parallel on either side of the means for supporting and/or moving the substrate;
  feeding or passing a glass substrate into the reaction chamber;
  putting into operation a high power supply, supplying a power of at least 50 kW;
  detecting the amplitude of the voltage at the terminals of said electrodes and the amplitude of the current circulating between said electrodes;
  defining the maximum number of alternations of voltage at the terminals of the electrodes in the presence of a hot electric arc (n max) in order not to exceed 50 Joules as dissipated energy in said substrate;
  when a variation of the amplitude of said two parameters results from the triggering of a hot electric arc between said electrodes, modifying with inverse feedback the voltage at the terminals of said electrodes before the defined maximum number of alternations of voltage at the terminals of the electrodes is reached;
wherein $$n\max = \frac{50 \text{ Joules}}{P[\text{W}] * \frac{1}{f}[\text{s}]}$$

with
  n=number of alternations,
  P=power dissipated into the electrical arc, expressed in watts,
  f=frequency, expressed in Hz.

This process has the advantage of offering a faster response than the prior art known processes, thereby not only avoiding breakage of the glass substrate, but also reducing and/or avoiding visual defects appearing in the glass substrate before breakage.

It is moreover particularly adapted to DBD installations for treating large plate-shaped pieces of glass (for example of at least 1 m width, i.e. with electrodes of at least 1 m length) or a continuously moving ribbon of glass, in which high power is used: at least 50 kW or at least 100 kW, preferably at least 200 kW or at least 500 kW, still more preferably at least 600 kW or at least 800 kW.

According to an advantageous embodiment the modification of the voltage by said inverse feedback loop is a voltage cutoff.

According to an advantageous embodiment the modification of the voltage by said inverse feedback loop is a multiple cutoff. Each cutoff can be followed, for example, by an automatic reset after a predetermined time and/or after a predetermined number of cutoffs (3, for example); then the cutoff will become definitive and a reset action will be necessary. This mode of operation has the advantage of removing a short-lived fault without production loss.

According to an advantageous embodiment said inverse feedback loop is able to modify the voltage at the terminals of said electrodes after a time corresponding to a number of alternations of the voltage at the terminals of the electrodes in the range of between 20 and 500.

According to an advantageous embodiment the process applies to an installation for surface treatment of a glass substrate by dielectric barrier discharge comprising a chamber, transport means and support means for feeding a substrate into the chamber, a high-voltage and high-frequency power supply connected to at least two electrodes, wherein said electrodes are arranged on either side of the transport and support means of the substrate, at least one dielectric barrier arranged between said electrodes, means for adjusting and controlling the power supply, means for feeding reactive substances into the chamber, means for extracting background substances, wherein this installation is appropriate for generating a plasma so that a surface treatment can be performed on said substrate.

The invention also relates to a surface treatment DBD installation comprising:

- a reaction chamber, in which are positioned means for supporting and/or moving a substrate and at least two electrodes arranged in parallel on either side of the means for supporting and/or moving the substrate;
- means for detecting the amplitude of the voltage at the terminals of said electrodes and the amplitude of the current circulating between said electrodes;
- means for defining the maximum number of alternations of voltage at the terminals of the electrodes in the presence of a hot electric arc (n max) in order not to exceed 50 Joules as dissipated energy in said substrate;
- means for modifying with inverse feedback the voltage at the terminals of said electrodes, when a variation of the amplitude of said two parameters results from the triggering of a hot electric arc between said electrodes, before the defined maximum number of alternations of voltage at the terminals of the electrodes is reached;

wherein $$n\max = \frac{50 \text{ Joules}}{P[\text{W}] * \frac{1}{f}[\text{s}]}$$

with
n=number of alternations
P=power dissipated into the electrical arc, expressed in watts
f=frequency, expressed in Hz.

According to an advantageous embodiment, the means for detecting the amplitude of the voltage at the terminals of the electrodes and the means for detecting the amplitude of the current circulating between said electrodes are placed as close to the electrodes as possible in order to reduce their reaction time.

According to a preferred embodiment the surface treatment by dielectric barrier discharge takes place at atmospheric pressure or at a pressure close thereto.

BRIEF DESCRIPTION OF THE FIGURES

These aspects as well as other aspects of the invention will be clarified in the detailed description of particular embodiments of the invention with reference to the drawings of the figures, wherein.

The figures are not drawn to scale. In general, similar elements are represented by similar references in the figures.

DETAILED DESCRIPTION OF PARTICULAR EMBODIMENTS

In the case of a process for surface treatment by dielectric barrier discharge that consists of using a plasma generated by two electrodes, between which a dielectric barrier is interposed, the normal stage of operation is referred to as the filament stage. It corresponds to an intermediate stage between the glow discharge stage and the electric arc stage referred to above. In the filament stage the power supplied by the HF source is distributed uniformly per unit area between the two electrodes in the form of a multitude of electric discharges that are unstable but have a high energy level. In the case where the target substrate is itself the dielectric barrier at the start of the triggering of the filament plasma and has imperfections such as e.g. a gaseous bubble, a metal incrustation or a local temperature gradient, a transition of the filament stage to the arc stage is possible. This transition is characterised by the concentration of all the power initially distributed over the entire surface of the electrodes onto a very small area in the order of a few square millimeters. In DBD jargon such an arc is usually qualified as a "hot arc" in contrast to filament discharges present in the normal stage of operation of the process. A hot arc has such a power concentration that it can cause damages and sometimes even destruction of the substrate (especially in the case of a glass sheet) and the electrodes.

Figure 1:
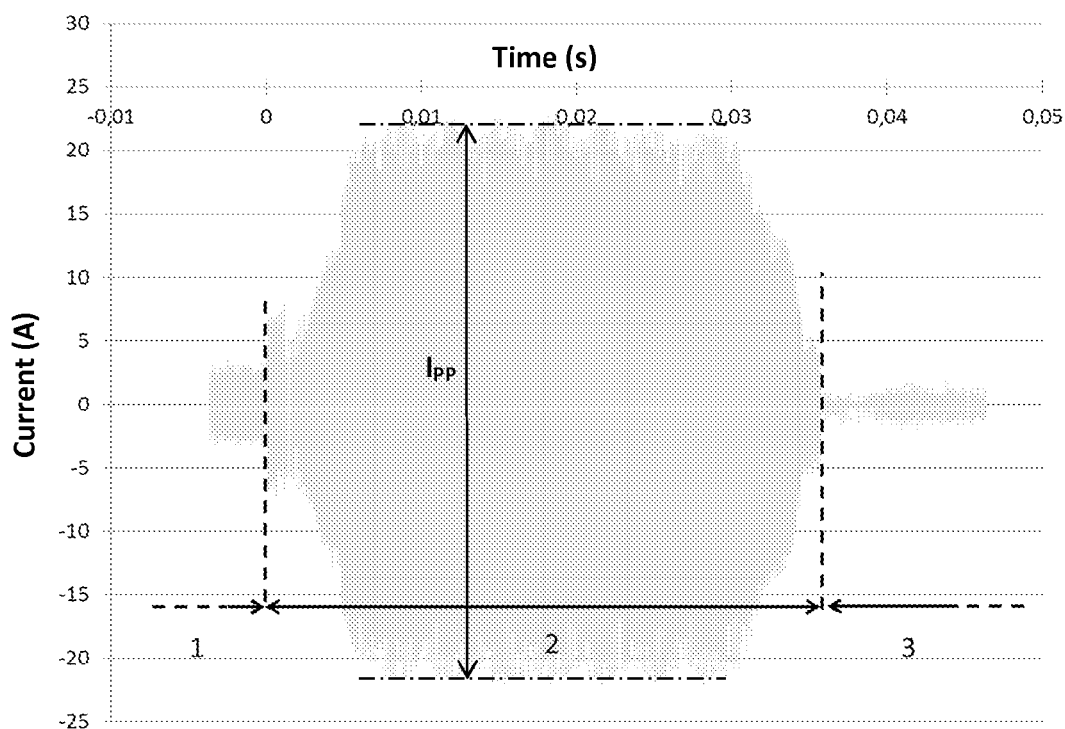
FIG. 1 is a graph of the electric current at the terminals of the electrodes during the occurrence of an electric arc for a 50 kW generator.

FIG. 1 demonstrates the variation in the current observed during the transition between the filament stage 1 and the hot electric arc stage 2 in the case of a DBD installation for the surface treatment of glass substrates, the power of the source of which is 50 kW. This transition is marked by an increase in current in the order of 1000% and the transition time between the two stages is in the order of 10 µs. Stage 3 represented on the graph corresponds to the residual current circulating between the electrodes after the cutoff of the fuses of the voltage generator. At this stage the glass substrate is already no longer usable since the energy that has been transmitted to it by the electric arc is more than 50 joules, which is the threshold value associated with irreversible damage thereof. It will be noted that it is impossible in practice to limit the energy transmitted to the substrate by the hot electric arc at a value less than 10 joules, since the latter corresponds to the energy already present in the installation in the form of reactive power before the beginning of the hot arc. In practice, the number of alternations of voltage at the terminals of the electrodes that should not be exceeded in the presence of a hot electric arc is in the range of between 20 and 500. This number of alternations is associated with a maximum energy that should not be exceeded before causing irreversible damage to the glass substrate for typical power values of an industrial installation for surface treatment by dielectric barrier discharge.

As defined herein the number of alternations of voltage at the terminals of the electrodes that should not be exceeded in the presence of a hot electric arc:

$$n\max = \frac{50 \text{ Joules}}{P[W] * \frac{1}{f}[s]}$$

with
n=number of alternations
P=power dissipated into the electrical arc, expressed in watts
f=frequency, expressed in Hz The power dissipated into the electrical arc (P) is defined with the following formula:

$$P = \frac{I_{PP}}{2\sqrt{2}} * \frac{V_{PP}}{2\sqrt{2}}$$

with
$I_{PP}$=current intensity peak-to-peak
$V_{PP}$=voltage peak-to-peak

Figure 2:
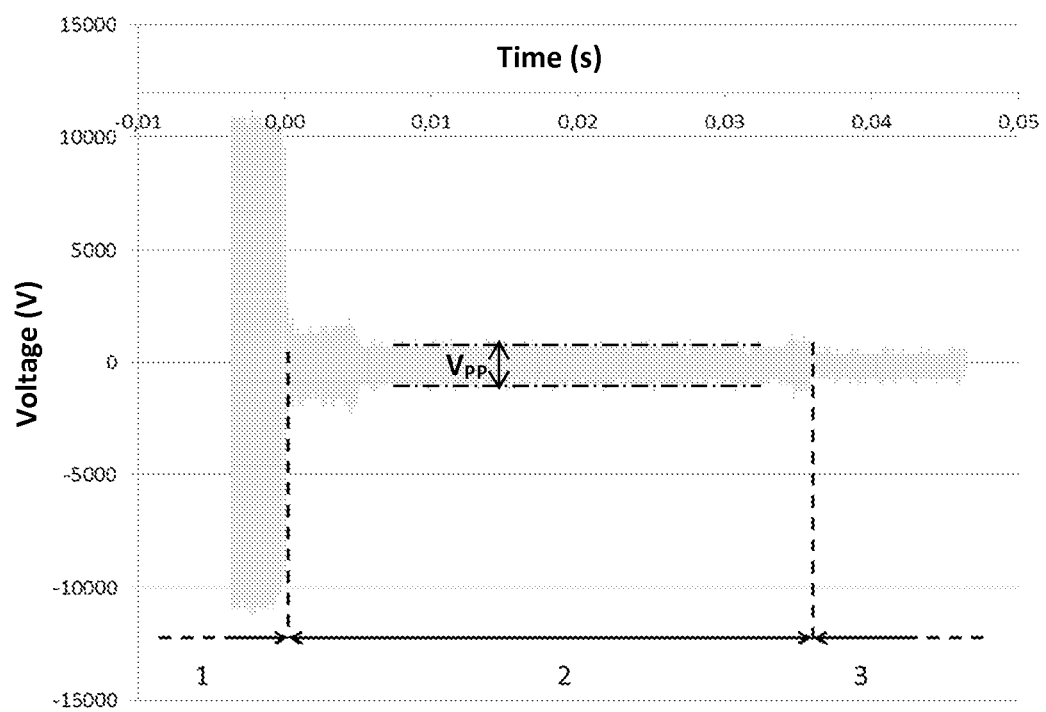
FIG. 2 is a graph of the electric voltage at the terminals of the electrodes during the occurrence of an electric arc for a 50 kW generator.

FIG. 2 shows the voltage variation associated with the hot arc stage described with respect to FIG. 1. The transition between the two stages is marked by a significant drop in voltage, the gradient of which is much more abrupt than that of the increase in current. The voltage drop consequently constitutes a signal that is generally easier to make use of from the occurrence of a hot arc than the increase in current associated with it.

Figure 3:
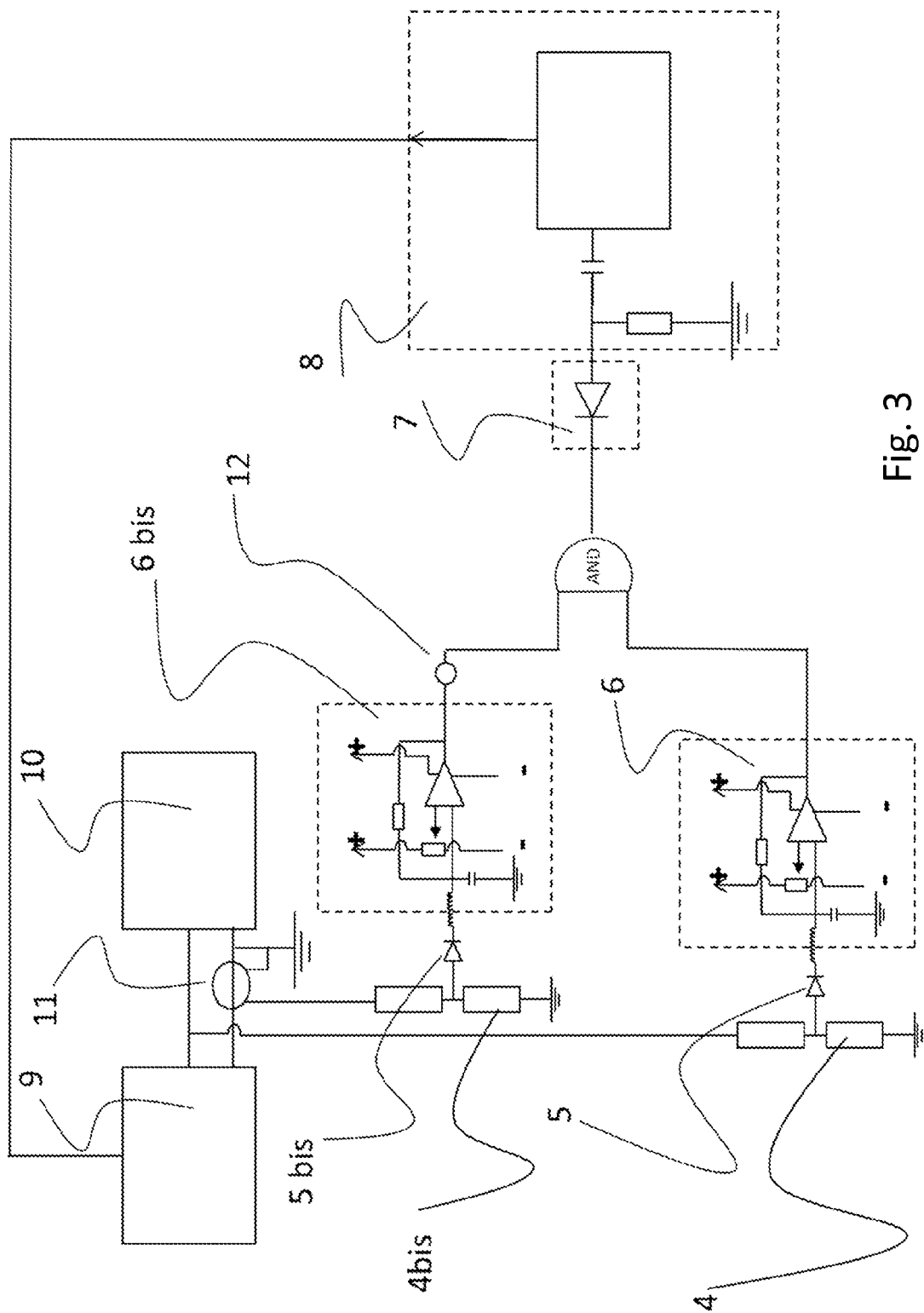
FIG. 3 is a circuit diagram of an embodiment of the invention.

The embodiment of the invention shown in FIG. 3 is based on the detection of the voltage at the terminals of the electrodes of the installation and of the amplitude of the current circulating between said electrodes. It is preferably placed as close as possible to the electrodes in order to minimise the reaction time when a "hot" arc occurs. The high-voltage power supply 9 and the reaction chamber 10 of the installation are shown schematically.

The first element of the voltage detection device is a voltage divider 4 necessary to reduce the significant voltage applied between the electrodes of a classic installation for surface treatment by dielectric barrier discharge. The second element is a diode 5 that enables the value of the amplitude of the voltage to be detected by removing sinusoidal variations associated with an alternating voltage. The following element 6 is a circuit, the principal element of which is a differential amplifier that receives as input the amplitude of the voltage detected by the diode 5 and compares this with a threshold value characteristic of the occurrence of an electric arc. Associated with this differential amplifier is a time constant that must be chosen judiciously to only detect the transitions between a filament stage and a hot arc stage without detecting the triggering of the filament stage that results during the startup of the installation and corresponds to the normal operation thereof.

A similar circuit is used for the current detection device (noted with "bis"), further including a current sensor 11 and an inverter 12.

The following element is an "AND" gate which converts the amplitude of the voltage and the amplitude of the current, as well as any modification thereto, into a logical function.

A diode 7 is placed downline of the differential amplifiers to only detect the negative variations in the "AND" gate logical function.

Then trigger circuit 8, the sweep state of which follows the value that is transmitted to it by the diode 7 and the output of which acts directly on the generator of the installation. This final element of the feedback loop switches off the generator if a hot electric arc occurs and lasts more than n max, in order to protect the substrate from the damage it would suffer without the presence of this device. To prevent production interferences, the device is on automatic reset after a time interval in the range of between 0.2 and 10 seconds. After three attempts to automatically reset, the power source is taken out of operation.

It will be evident to a person skilled in the art that the present invention is not limited to the examples illustrated and described above. The presence of reference numbers cannot be considered as restrictive. The use of the term "comprises" cannot in any way exclude the presence of elements other than those mentioned. The use of the indefinite article "a" to introduce an element does not exclude the presence of a plurality of these elements.

The invention claimed is:

1. A process for preventing substrate damage(s) in an installation for surface treatment by dielectric barrier discharge (DBD) comprising:
   providing a DBD installation comprising a reaction chamber, in which are positioned means for supporting and/or moving a substrate and at least two electrodes arranged in parallel on either side of the means for supporting and/or moving the substrate;
   feeding or passing a glass substrate into the reaction chamber;
   putting into operation a high power supply, supplying a power of at least 50 kW;
   detecting an amplitude of a voltage at the terminals of said electrodes and an amplitude of a current circulating between said electrodes;
   defining a maximum number of alternations of voltage at the terminals of the electrodes in the presence of a hot electric arc (n max) in order not to exceed 50 Joules as dissipated energy in said substrate;
   when a variation of the amplitude of the voltage at the terminals of said electrodes and the amplitude of the current circulating between said electrodes results from triggering of the hot electric arc between said electrodes, modifying with inverse feedback the voltage at the terminals of said electrodes before the defined maximum number of alternations of voltage at the terminals of the electrodes is reached;
   wherein $$n\max = \frac{50 \text{ Joules}}{P[W] * \frac{1}{f}[s]}$$

where
n=number of alternations,
P=power dissipated into the electrical arc, expressed in watts, and
f=frequency, expressed in Hz.

2. The process according to claim 1, characterised in that the modification of the voltage by said inverse feedback loop is a voltage cutoff.

3. The process according to claim 1, characterised in that the modification of the voltage by said inverse feedback loop is a multiple cutoff.

4. The process according to claim 1, characterised in that said inverse feedback loop is able to modify the voltage at the terminals of said electrodes after a time corresponding to a number of alternations of the voltage at the terminals of the electrodes in the range of between 20 and 500.

5. The process according to claim 1 which takes place in an installation for surface treatment of a substrate by dielectric barrier discharge comprising a chamber, transport means and support means for feeding a substrate into the chamber, a high-voltage and high-frequency power supply connected to at least two electrodes, wherein said electrodes are arranged on either side of the transport and support means of the substrate, at least one dielectric barrier arranged between said electrodes, means for adjusting and controlling the power supply, means for feeding reactive substances into the chamber, means for extracting background substances, wherein said installation is appropriate for generating a plasma so that a surface treatment can be performed on said substrate.

6. The process according to claim 1, wherein the means for detecting the amplitude of the voltage at the terminals of the electrodes and the means for detecting the amplitude of the current circulating between said electrodes are placed as close to the electrodes as possible.

7. A process for reducing substrate breakage, substrate deformation, visual defects in a substrate, or other damage to a glass substrate caused by surface treatment of a glass substrate by dielectric barrier discharge (DBD) comprising:

feeding or passing a glass substrate into a reaction chamber for dielectric barrier discharge that comprises a support for the glass substrate positioned between at least two electrodes arranged in parallel on either side of said support operably connected to a power supply of at least 50 kw;

dissipating into said glass substrate between the electrodes by dielectric discharge between the at least two electrodes an amount of energy that does not exceed 50 Joules, wherein the number of alternations of voltage between the electrodes is modulated so as not exceed n max by modifying with inverse feedback the voltage at the terminals of said electrodes before the defined maximum number of alternations of voltage at the terminals of the electrodes is reached;

wherein $$n\max = \frac{50 \text{ Joules}}{P * \frac{1}{f}}$$

where
n=number of alternations,
P=power dissipated into the electrical arc expressed in watts, and
f=frequency expressed in Hz.

8. The process of claim 7 which reduces the formation of hot arcs during dielectric discharge compared to an otherwise identical process where the number of alternations of voltage between the electrodes is not modulated so as not to exceed n max.

9. The process of claim 7, wherein said glass substrate is plate-shaped.

10. The process of claim 7, wherein said glass substrate is a moving ribbon of glass.

* * * * *